(12) United States Patent
Joynt et al.

(10) Patent No.: US 11,133,388 B1
(45) Date of Patent: Sep. 28, 2021

(54) SILICON-GERMANIUM HETEROSTRUCTURES WITH QUANTUM WELLS HAVING OSCILLATORY GERMANIUM CONCENTRATION PROFILES FOR INCREASED VALLEY SPLITTING

(71) Applicant: Wisconsin Alumni Research Foundation, Madison, WI (US)

(72) Inventors: Robert J. Joynt, Madison, WI (US);
Mark G. Friesen, Middleton, WI (US);
Mark A. Eriksson, Madison, WI (US);
Susan Nan Coppersmith, Madison, WI (US); Donald E. Savage, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 16/936,697

(22) Filed: Jul. 23, 2020

(51) Int. Cl.
| | |
|---|---|
| *G06N 10/00* | (2019.01) |
| *G06F 15/82* | (2006.01) |
| *H01L 29/16* | (2006.01) |
| *H01L 29/165* | (2006.01) |
| *C22C 28/00* | (2006.01) |
| *H01L 29/06* | (2006.01) |
| *H01L 29/15* | (2006.01) |
| *B82Y 10/00* | (2011.01) |

(52) U.S. Cl.
CPC ............ *H01L 29/165* (2013.01); *C22C 28/00* (2013.01); *H01L 29/0665* (2013.01); *H01L 29/151* (2013.01); *B82Y 10/00* (2013.01)

(58) Field of Classification Search
CPC . H01L 29/0665; H01L 29/122; H01L 29/125; H01L 29/127; H01L 29/15; H01L 29/151; H01L 29/165; H01L 29/66977; B82Y 10/00; G06N 10/00; C22C 28/00
See application file for complete search history.

(56) References Cited

U.S. PATENT DOCUMENTS

| | | | |
|---|---|---|---|
| 6,597,010 B2 | 7/2003 | Eriksson et al. | |
| 9,941,430 B2 | 4/2018 | Andreev et al. | |
| 10,572,814 B2 | 2/2020 | Friesen et al. | |
| 2009/0101887 A1* | 4/2009 | Dahlstrom | ............ H01L 29/155 257/14 |

(Continued)

OTHER PUBLICATIONS

Yang et al., "Spin-valley Lifetimes in a Silicon Quantum Dot with Tunable Valley Splitting," *Nature Communications*, 4:2069, 8 pages, 2013.

(Continued)

*Primary Examiner* — David C Spalla
(74) *Attorney, Agent, or Firm* — Bell & Manning, LLC; Michelle Manning

(57) ABSTRACT

Semiconductor heterostructures, methods of making the heterostructures, and quantum dots and quantum computation devices based on the heterostructures are provided. The heterostructures include a quantum well of strained silicon seeded with a relatively low concentration of germanium impurities disposed between two quantum barriers of germanium or a silicon-germanium alloy. The quantum wells are characterized in that the germanium concentration in the wells has an oscillating profile that increases the valley splitting in the conduction band of the silicon quantum well.

24 Claims, 7 Drawing Sheets

(56) References Cited

U.S. PATENT DOCUMENTS

| | | | |
|---|---|---|---|
| 2011/0147711 A1* | 6/2011 | Pillarisetty | H01L 29/1054 |
| | | | 257/24 |
| 2019/0044045 A1* | 2/2019 | Thomas | H01L 39/025 |
| 2019/0334020 A1* | 10/2019 | Amin | H01L 21/02532 |

OTHER PUBLICATIONS

Zhang et al., "Genetic design of enhanced valley splitting towards a spin qubit in silicon," *Nature Communications*, 4:2396, 7 pages, 2013.

Srinivasen et al., "Valley splitting in Si quantum dots embedded in SiGe," *Applied Physics letters*, arXiv:0808.1234v1, Aug. 8, 2008.

Meghan Steele Horan, "Physicists device new approach to manipulate silicon 'quibits'" *Phys.org*, https://phys.org/news/2017-07-physicists-approach-silicon-qubits.html, Jul. 7, 2017.

Vandersypen et al., "Quantum computing with semiconductor spins," *Physics Today* 72, 8 38 (2019).

Hollmann et al., "Large, tunable valley splitting and single-spin relaxation mechanisms in a $Si/Si_xGe_{1-x}$ quantum dot," arXiv:1907.04146v2, Mar. 30, 2020.

McGuire et al., "Valley splitting in a Si/SiGe quantum point contact," *New J. Phys,*. 12, 033039, 2010.

Neyens et al., "Measurements of capacitive coupling within a quadruple quantum dot array," arXiv:907.08216v1, Jul. 18, 2019.

Watson et al., "A programmable two-qubit quantum processor in silicon," arXiv:1708.04214v2, May 31, 2018.

* cited by examiner

US 11,133,388 B1

SILICON-GERMANIUM HETEROSTRUCTURES WITH QUANTUM WELLS HAVING OSCILLATORY GERMANIUM CONCENTRATION PROFILES FOR INCREASED VALLEY SPLITTING

REFERENCE TO GOVERNMENT RIGHTS

This invention was made with government support under W911NF-17-1-0274 awarded by the ARMY/ARO. The government has certain rights in the invention.

BACKGROUND

Silicon-Germanium (SiGe) heterostructures are used for many purposes in the modern electronics industry, forming the basis of devices, such as SiGe heterojunction bipolar transistors and Si/SiGe modulation-doped field effect transistors. Most recently, SiGe alloys have become a material of choice for quantum computing applications. In particular, silicon quantum dots formed in the silicon well of an Si/SiGe heterostructure have been used to trap electrons in qubits for quantum computing, wherein the spins of the trapped electrons store and process quantum information. An advantage of the Si/SiGe heterostructures is that silicon provides a clean magnetic environment with a low noise level, a crucial requirement for quantum computing.

The electrons in silicon quantum wells of the Si/SiGe quantum dot structures can occupy different valleys in the conduction band structure. For most purposes, and for many quantum bits for quantum computing, this valley degree of freedom for electrons is an unwanted complication, since the additional transitions prevent clean control of qubit states in quantum computing devices. This unwanted complication occurs because the energy splitting between valley states is comparable to the energy splitting between electron spin states. Hence much effort has been put into making the valley splittings in the conduction band of silicon larger, with limited success.

SUMMARY

Semiconductor heterostructures, gate-controlled quantum dots based on the heterostructures, quantum computing systems, and methods of forming a quantum-confined semiconductor heterostructures.

One embodiment of a semiconductor heterostructure includes: a first quantum barrier comprising a layer of silicon-germanium alloy or a layer of germanium; a second quantum barrier comprising a layer of silicon-germanium alloy or a layer of germanium; and a quantum well comprising strained, germanium-seeded silicon positioned between the first quantum barrier and the second quantum barrier. The germanium concentration in the germanium-seeded silicon has an oscillating profile across the quantum well and the conduction band of the quantum well has a valley splitting of at least 80 µeV.

One embodiment of a gate-controlled quantum dot includes a semiconductor heterostructure comprising: a first quantum barrier comprising a layer of silicon-germanium alloy or a layer of germanium; a second quantum barrier comprising a layer of silicon-germanium alloy or a layer of germanium; and a quantum well comprising strained, germanium-seeded silicon positioned between the first quantum barrier and the second quantum barrier, wherein the germanium concentration in the germanium-seeded silicon has an oscillating profile across the quantum well. The gate-controlled quantum dot further includes one or more electrostatic gates in electrical communication with the semiconductor heterostructure, wherein the one or more electrostatic gates are configured to apply a controllable potential to the quantum well that confines electrons in the quantum well in three dimensions.

One embodiment of a quantum computing system for performing quantum includes a semiconductor heterostructure comprising: first quantum barrier comprising a layer of silicon-germanium alloy or a layer of germanium; a second quantum barrier comprising a layer of silicon-germanium alloy or a layer of germanium; and a quantum well comprising strained, germanium-seeded silicon positioned between the first quantum barrier and the second quantum barrier, wherein the germanium concentration in the germanium-seeded silicon has an oscillating profile across the quantum well. The quantum computing system further includes: one or more electrostatic gates in electrical communication with the semiconductor heterostructure, the one or more electrostatic gates being configured to apply controllable potentials to the quantum well, wherein the controllable potentials define one or more gate-controlled qubits in the heterostructure; a controller for controlling the potentials applied by the one or more electrostatic gates; and a sensor for reading out a state of the one or more qubits.

One embodiment of a method of forming a quantum-confined semiconductor heterostructure, the method including the steps of: growing a quantum well layer of strained, germanium-seeded silicon on a first quantum barrier layer comprising germanium or a germanium-silicon alloy via pulsed chemical vapor deposition using a pulse sequence comprising: a first pulse having a germanium concentration that corresponds to a peak germanium concentration; and a germanium-free pulse, wherein the pulse sequence is repeated at least twice; and growing a second quantum barrier layer comprising germanium or a germanium-silicon alloy over the quantum well layer.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

DETAILED DESCRIPTION

Semiconductor heterostructures, methods of making the heterostructures, and qubits based on the heterostructures are provided. The heterostructures include a quantum well of strained silicon seeded with germanium impurities positioned between two quantum barriers of germanium (Ge) or silicon-germanium (SiGe) alloy. A key feature of the quantum well is that the germanium concentration in the well has an oscillating profile that increases the valley splitting in the conduction band of the quantum well, relative to the valley splitting in the absence of the germanium impurities. The increased valley splitting makes it possible to cleanly control the qubit states of a qubit incorporating the heterostructure without interference from the valley splitting. The oscillating germanium concentration profile can be formed in the silicon using standard growth techniques, such as pulsed chemical vapor deposition (CVD), without the need to achieve atomically smooth interfaces and/or the need to use difficult to control processing conditions.

Figure 1:
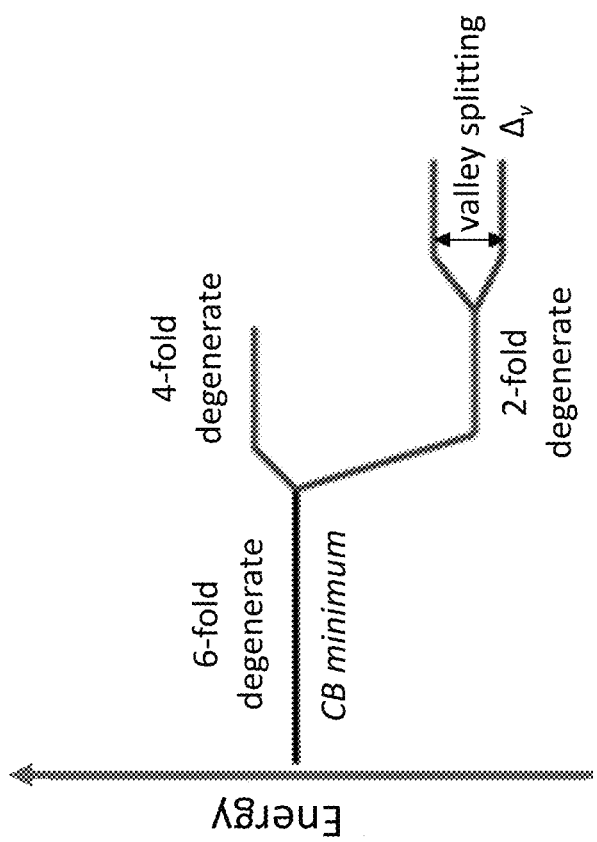
FIG. 1 is a band energy diagram showing the valley splitting in strained and quantum confined silicon.

FIG. 1 shows the valley splitting in silicon. Bulk silicon has a six-fold orbital degeneracy that can be lifted by both strain and quantum confinement. Under strain, the six-fold valley degeneracy in the silicon conduction band is reduced to two-fold. Quantum confinement further reduces this degeneracy. The energy gap to the first excited valley state is referred to as the valley splitting, $\Delta_v$.

Although the inventors do not intend to be bound to any particular theory of the invention, the increased valley splitting in the quantum well may be explained as follows. The valleys in the conduction band in strained Si are at wavenumbers $k_0=(2\pi/a)(0,0,0.85)$. Here $a=0.543$ nm is the side of the conventional unit cell in Si. The electron wavefunctions for the lowest orbital states are:

$$\psi_{\pm \vec{k}_0}(\vec{x}) = F_{\pm}(z)\phi_{\pm}(\vec{x})e^{\pm i\vec{k}_0 \cdot \vec{x}}$$

These are superpositions of states near the valley minima. The F's are envelope functions and the φ's are Bloch functions at the minima. z is the depth from the surface of the structure. The valley splitting $\Delta_v$ is approximately:

$$|\Delta_v| = 2|\int F^2(z)\phi_-^*(\vec{x})\phi_+(\vec{x})e^{\pm ik_0z}V(z)d^3x|.$$

The wavelength of the oscillating germanium concentration profile in the silicon quantum wells is designed to increase $\Delta_v$. This can be accomplished at a variety of wavelengths, where wavelength refers to the distance between neighboring maxima or minima in the oscillating germanium concentration profile. For example, by engineering the quantum well so that $F^2(z) V(z)$ has a large Fourier component at the wavenumber $(0,0,4\pi/a-2k_0)$ corresponding to a germanium concentration oscillation having wavelength of 1.8 nm. This will cancel the oscillation of the exponential factor in the integrand, producing a large enhancement in $\Delta_v$. F(z) is slowly varying, so it is principally V(z) that is the focus of the quantum well design strategy. By way of further illustration, an alternative germanium concentration oscillation wavelength that produces similar effects uses the wavenumber $(0, 0, 2k_0)$ corresponding to a wavelength of 0.32 nm. Oscillations of V(z) with this repeat distance can also be used to increase $\Delta_v$.

Figure 2:
FIG. 2 is a schematic illustration of a heterostructure that includes a germanium-seeded quantum well sandwiched between two GeSi barriers. The sinusoidally-varying concentration of germanium in the silicon well is represented by the sine wave.

By using an oscillating germanium concentration in the quantum well layer, the size of the valley splitting can be controlled, and valley splittings of at least 80 μeV, and even at least 100 μeV, can be achieved. The ability to engineer valley splittings in the range from about 20 μeV to about 40 μeV is particularly advantageous because this is a desirable range for the valley splitting for quantum dot hybrid qubits (QDHQ) in silicon. The QDHQ, which is composed of three electrons in a tunnel-coupled double quantum dot, operates at zero magnetic field, and can be manipulated on time scales as short as a few nanoseconds. (See, for example, "A fast 'hybrid' silicon double quantum dot qubit." Zhan Shi et al., Phys. Rev. Lett. 108, 140503 (2012); "Quantum control and process tomography of a semiconductor quantum dot hybrid qubit." Dohun Kim et al., Nature 511, 70 (2014); and "Microwave-driven coherent operations of a semiconductor quantum dot charge qubit." Dohun Kim et al., Nature Nanotech. 10, 243 (2015).) An essential ingredient in the manipulation of the QDHQ is achieving an energy splitting between the qubit states 0 and 1 that simultaneously is greater than kT (~2 GHz in typical experiments) and low enough to be in a convenient microwave frequency range (less than 20 GHz is ideal). Valley splittings greater than 100 μeV (about 25 GHz) can be achieved for the germanium-seeded quantum wells described herein. This provides a way to get the qubit energy splitting much less than the valley splitting. This eliminates the uncontrolled degree of freedom for the electrons that prevents clean control of qubit states As used herein, the term oscillating concentration profile refers to a concentration profile that varies repetitively between maximum and minimum concentrations. The shape of the oscillating profile can take a variety of forms but will be characterized by a plurality of peaks alternating with a plurality of troughs. The peaks and troughs in the profile generally have a uniform or a substantially uniform spacing, width, and amplitude. By way of illustration, the concentration of germanium may vary continuously and gradually between the peaks and troughs of the concentration profile, as in the case of a sinusoidal profile or a triangular wave profile, may change abruptly between a low (e.g., zero) concentration of germanium and a maximum concentration of germanium, as in the case of a series of delta functions or a square wave function, or may take on a oscillating form intermediate between a continuously and gradually varying and an abruptly changing profile. By way of illustration, FIG. 2 shows a silicon quantum well 202 sandwiched between a first GeSi quantum barrier 204 and a second GeSi quantum barrier 206. The concentration of the germanium impurities as a function of position in the quantum well is represented by a sine wave.

It should be noted, however, that perfectly uniform spacings, widths, and amplitudes are not required. More particularly, in the case of sinusoidal profile, a perfect sine wave profile is not required, as illustrated by the sine wave-like germanium concentration profile shown in FIGS. 3A and 3B, which was achieved experimentally, as described in Example 1. For the purposes of this disclosure, a sinusoidal profile includes true sine wave profiles as well as sine wave-like profiles that have a nominal wavelength and sine wave shape, but that deviate from a prefect sine wave due to experimental limitations. These sine wave-like sinusoidal profiles may be fit by or modeled as sine waves.

The concentration of germanium in the silicon well will vary from a maximum value to a minimum value along the concentration profile. Generally, a higher germanium concentration can provide a higher splitting. However, higher germanium concentrations will also provide a less clean environment and may lead to electron scattering. Thus, in practice, the optimal germanium concentration may be based on a trade-off between these considerations. By way of illustration, some embodiments of the silicon quantum well layers have a maximum germanium concentration (i.e., a germanium concentration at the peaks in the profile) in the range from about 5 atomic percent (at. %) to about 30 at. %. This includes embodiments of the silicon quantum well layers having a maximum germanium concentration in the range from about 10 at. % to about 30 at. %.

The first and second quantum barrier layers comprise SiGe alloy or germanium. The quantum barrier layer material can be represented by the formula $Si_xGe_{(1-x)}$, wherein $0 \leq x < 1$, with a typical nominal value of 0.7. When a graded and relaxed SiGe is used as a barrier layer, a strained silicon quantum well layer can be grown thereon. Graded and relaxed SiGe can be formed on a silicon wafer by growing a layer of SiGe epitaxially until it terminates in the desired composition. The quantum barrier layers and the quantum well layer are designed to provide quantum confinement of electrons in the well, with typical thicknesses ranging from tens to hundreds of nanometers.

Notably, the quantum well design does not rely on atomically sharp interfaces between the quantum barrier layers and the quantum well layer or within the quantum well layer in order to achieve increased valley splitting. In fact, a suitable sine-wave like germanium concentration profile can be achieved using standard pulsed CVD processing by cyclically varying the germanium concentration in sequential pulses.

The SiGe barriers can be grown epitaxially using known techniques, and the germanium-seeded silicon quantum well can be grown on the GeSi. In one example of a method of making the germanium-seeded silicon layer, a pulsed CVD process is used in which the ratio of silicon to germanium is varied between pulses to produce a quasi-sinusoidal profile. In this process, multiple cycles, each including a series of sequential pulses, are used to grow a layer of silicon in which the concentration of germanium oscillates as a function of depth through the layer. In a first pulse of the series, the concentration of germanium in the pulse corresponds to the peak germanium concentration in the profile. This first pulse is, optionally, followed by one or more intermediate pulses in which the concentration of germanium is between zero and the peak germanium concentration. A germanium-free pulse is then used to define the minimum in the oscillating germanium concentration profile, optionally followed by one or more additional intermediate pulses to end the series.

Figure 3A:
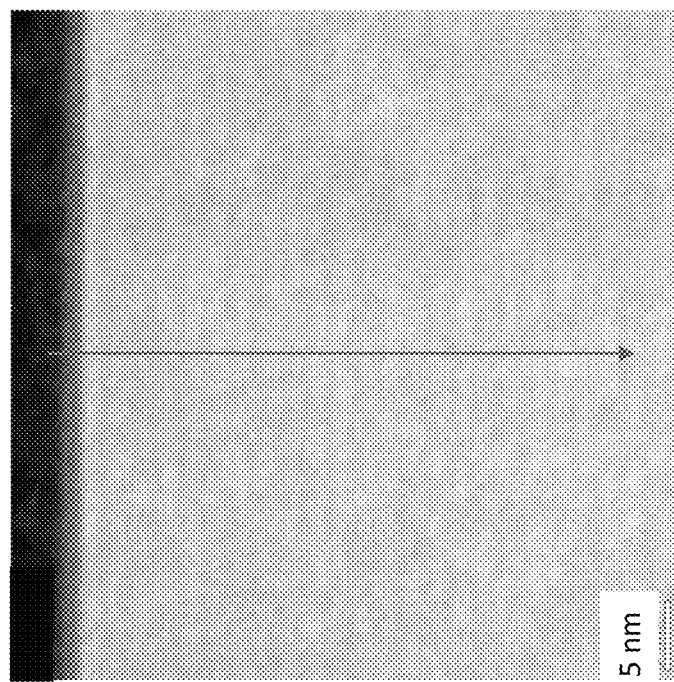
FIG. 3A is a transmission electron microscope image of a layer of germanium-seeded silicon grown on a silicon wafer. The silicon has an oscillating concentration of germanium.
Figure 3B:
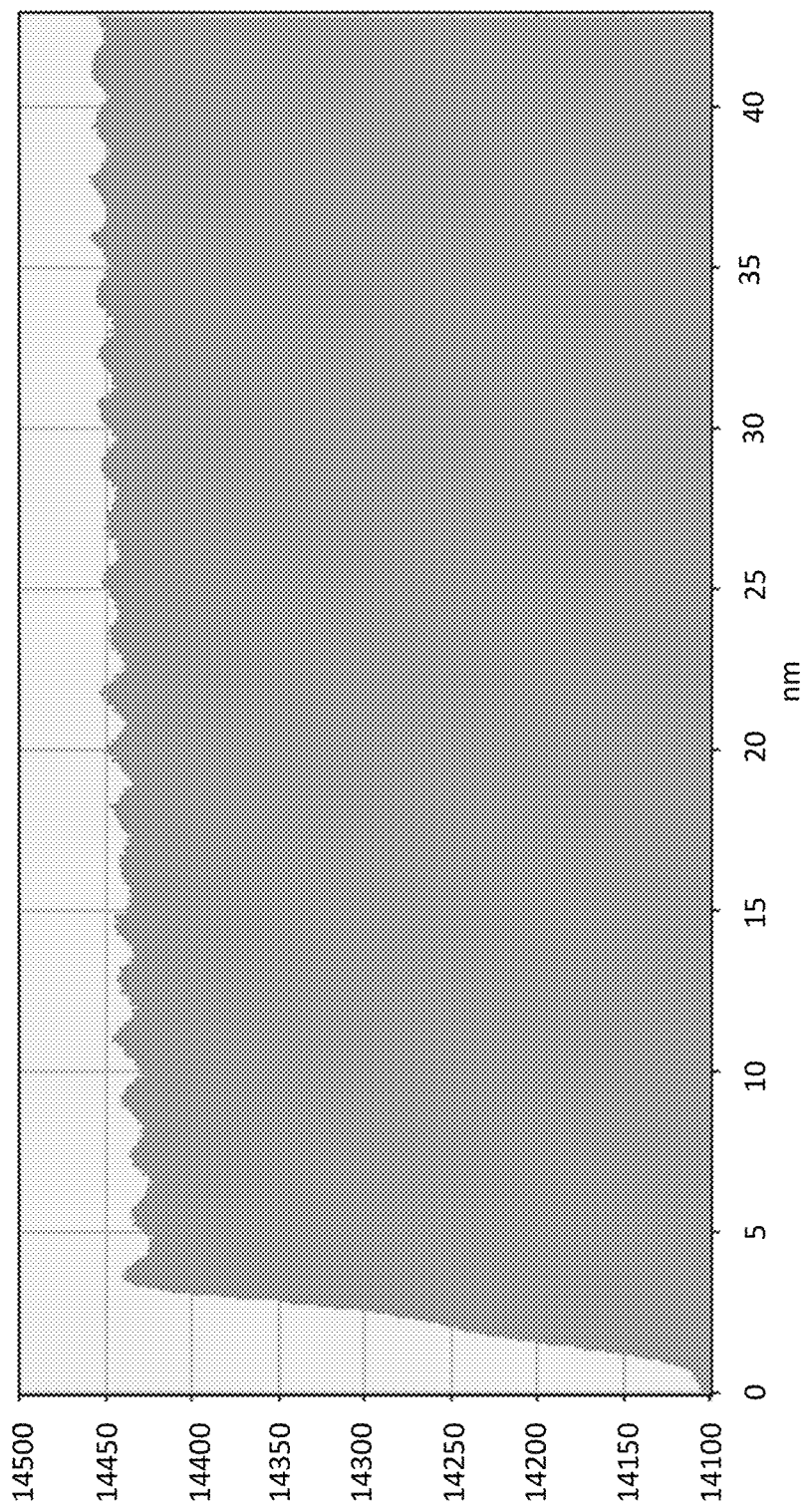
FIG. 3B is a graph of the germanium concentration along the direction of the arrow, integrated over 1000 pixels.

By way of illustration, a quasi-sinusoidal depth profile with a repeating period of 1.8 nm can be achieved by cycling through the following series of pulses: a 0.6 nm pulse of 10% Ge and 90% Si, followed by a 0.3 nm pulse of 5% Ge and 95% Si, followed by a 0.6 nm pulse of 100% Si, followed by a 0.3 nm pulse of 5% Ge and 95% Si, where the depth of material deposited in nm is indicated for each pulse. This pattern is repeated until it fills the whole active region, defined as the depths at which the electron density is non-negligible. The peak in the long 10% Ge pulse is desirably positioned so that the center of one such pulse is at the maximum in the electron density. Using this pulsed CVD sequence protocol, a 200 nm-thick layer of silicon was grown on a silicon wafer with a germanium concentration oscillating between pure silicon and 90:10 Si:Ge, as described in more detail in Example 1. A transmission electron microscope (TEM) image of the germanium-seeded silicon is shown in FIG. 3A, and the corresponding sine wave-like germanium concentration profile, having a nominal wavelength of 1.8 nm, is shown in FIG. 3B.

It should be noted, however, that other doping protocols and pulse sequences can be used to achieve the desired effect. Any procedure that gives a germanium density profile with the proper wavelength can be used to yield an increase in the valley splitting. For example, more pulses or pulses with different amplitudes may also be chosen. Different equipment and/or different sources of the constituent materials can also be used. For example, the quantum well layers can be made by molecular beam epitaxy as well as chemical vapor deposition. The epitaxy method may be more suitable for the shorter 0.32 nm repeat distance embodiment.

Once the heterostructures are formed, one or more electrodes (electrostatic gates) can be used to define one or more quantum dots in the heterostructures, and these one or more quantum dots can act as qubits in a quantum information processing device. In gate-controlled quantum dot systems, the electrostatic gates provide a controllable horizontal potential profile for the confinement of electrons in three dimensions. The movement of electrons in the quantum dots is restricted due to the confining potential, which results in bound states with discrete energy levels. The wavefunctions describing these states may then be utilized to establish the two-level system. Specifically, if the spatial part of an electron wavefunction is used, a charge qubit is achieved, with the spatial wavefunction defining the electron charge distribution. On the other hand, if the spin portion of the wavefunction is used, a spin qubit is produced. By tuning the confinement strength and electrochemical potential using lateral and/or vertical gates, as well as the coupling to other dots or reservoirs, the size and occupation of each dot can be controlled to obtain a wide variety of quantum systems for use in quantum computation.

A number of strategies can be used for designing electrostatic gates for applying electric fields to the heterostructures in order to define quantum dots and to perform qubit transformations in a quantum computing system. Descriptions of suitable gate configurations can be found in the literature, including in the following references: "Measurements of capacitive coupling within a quadruple quantum dot array." S. F. Neyens, E. R. MacQuarrie, J. P. Dodson, J. Corrigan, Nathan Holman, B. Thorgrimsson, M. Palma, T. McJunkin, L. F. Edge, Mark Friesen, S. N. Coppersmith, and M. A. Eriksson, *Phys. Rev. Applied* 12, 064049 (2019); and "A programmable two-qubit quantum processor in silicon." T. F. Watson, S. G. J. Philips, E. Kawakami, D. R. Ward, P. Scarlino, M. Veldhorst, D. E. Savage, M. G. Lagally, Mark Friesen, S. N. Coppersmith, M. A. Eriksson, and L. M. K. Vandersypen, *Nature* 555, 633 (2018).

One example of a quantum computing system includes at least two qubits located in quantum dots based on the heterostructures described herein. In some embodiments, more qubits are included in a quantum dot assembly. The system also includes a controller for controlling the qubits to perform a quantum computation and an output for providing a report generated using information obtained from the quantum computation performed.

Figure 4:
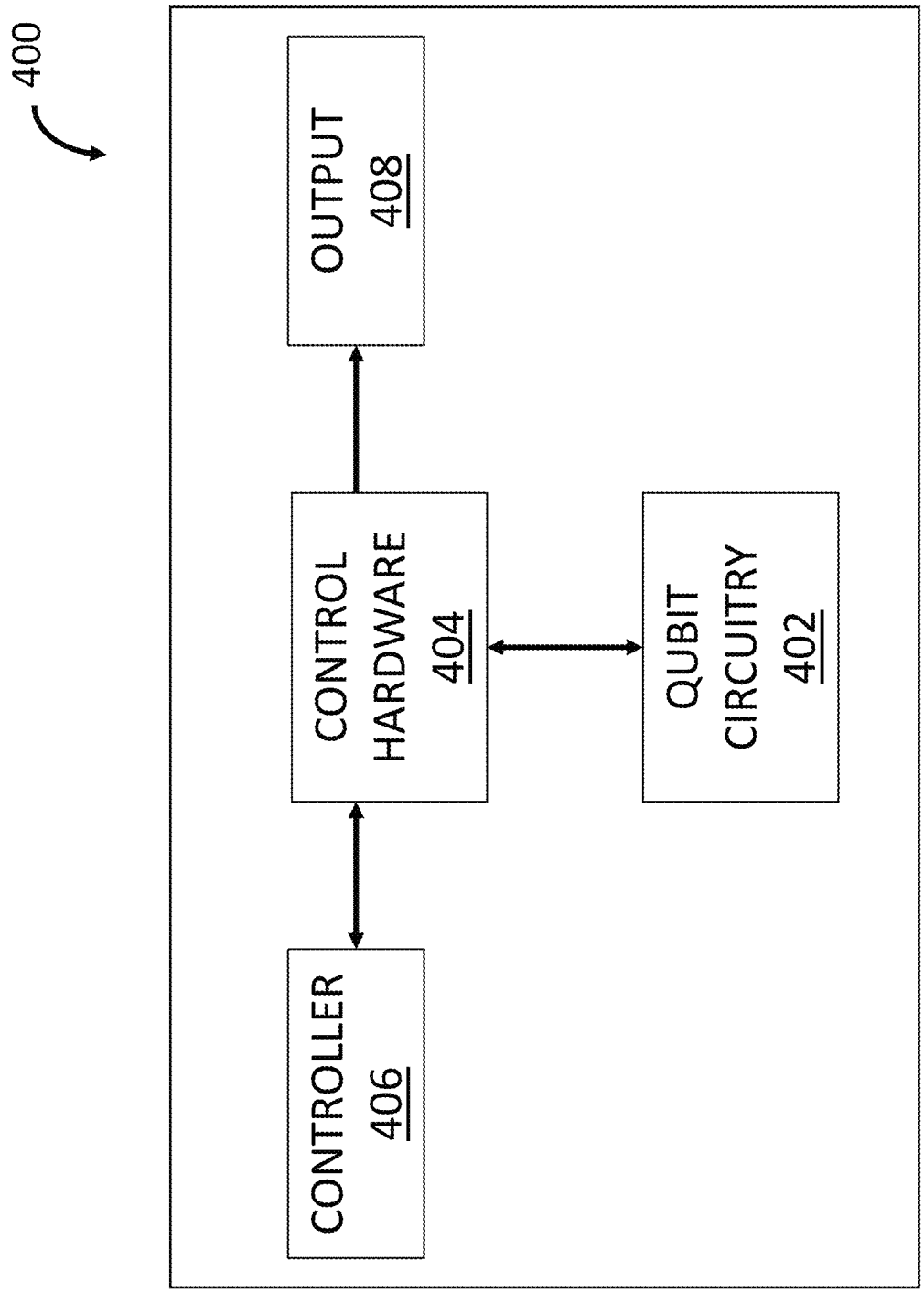
FIG. 4 is a schematic of an example system for use in quantum computation in accordance with the present disclosure.

Turning now to FIG. 4, an example quantum computing system 400 for quantum computation or quantum information processing in accordance with the present disclosure is shown. As shown, the system 400 can include qubit circuitry 402, control hardware 404 in communication with the qubit circuitry 402, and a controller 406 for directing the control hardware 404 to carry out various qubit manipulations and measurements, along with other operations. The system 400 also includes an output 408 for providing the quantum computation results. In general, the system 400 may be configured to operate over a broad range of conditions, and as such may include capabilities and hardware for achieving those conditions. For instance, although not shown in FIG. 4, the system 400 may be configured to achieve and sustain ultra-low temperatures, such as temperatures below a few Kelvin, using, for example, a refrigeration unit.

The qubit circuitry may be configured to initialize a qubit, perform qubit transformations, and read out the final state of a qubit or qubits. For instance, the qubit circuitry 402 may include one or more metallic gates configured to control charge confinement and states of the quantum dots in a quantum dot assembly. In addition to gates, the qubit circuitry 402 may also include one or more charge sensors coupled to the quantum dot assembly configured for measuring qubit states. Example charge sensors can include tunnel probes, quantum point contacts, single electron transistors, as well as other sensors for sensing charge. In addition, the qubit circuitry 402 may also include one or more sources or drains for measuring charge transport. Furthermore, the qubit circuitry 402 may also include elements for coupling of the quantum dot assembly to external components.

Referring again to FIG. 4, the control hardware 404 can include any number of electronic systems, hardware, or circuitry components capable of a wide range of functionality for controlling the qubit circuitry 402. For instance, the control hardware 404 can include one or more voltage sources, current sources, microwave sources, spectrometers, signal generators, amplifiers, and so forth. Such control hardware 404 may be configured to send, receive, and process a wide array of signals. For example, the control hardware 404 may be configured to generate a number of pulsed voltages, or currents, to achieved pulsed gates for implementing qubit operations.

In general, the control hardware 404, as directed by the controller 406, may be used to prepare the qubit(s) formed by the qubit circuitry 402, as described. For instance, the control hardware 404 may be configured to populate the quantum dot assembly with one or more electrons (or holes). In addition, the control hardware 404 may be configured to form qubit states for the charge qubit using different charge distributions having the same center of mass. In some aspects, the control hardware 404 may prepare and manipulate the qubit(s).

The control hardware 404 may perform a number of quantum logic operations, including the application of ac gates, dc gates, pulsed gates, and combinations thereof. The control hardware 404 can then readout the qubits(s), for instance, using one or more charge sensors, and provide, via the output 408, a report of any form for the quantum computation results obtained.

EXAMPLES

Example 1: CVD Growth of a Germanium-Seeded Silicon Quantum Well

This example illustrates the growth of a silicon quantum well layer having an oscillating germanium concentration. Typically, a linearly-graded relaxed buffer layer (e.g., graded to 30% Ge over 3 microns) is grown on a silicon wafer via CVD, followed by the CVD growth of a several micron thick layer of $Si_{0.7}Ge_{0.3}$ and the resulting structure is subsequently chemo-mechanically polished. After cleaning, an additional 500 nm $Si_{0.7}Ge_{0.3}$ layer was deposited with CVD before the quantum well structure was grown. The concentration of germanium in the germanium-seeded silicon layer was adjusted during quantum well growth by adjusting the relative flow rates of silane and germane precursor gases during growth. A flow of the germane gas mixture (10% germane, balance hydrogen) of 4.92 sccm for 10.9 seconds was used to yield a peak germanium concentration in the quantum well of $Si_{0.9}Ge_{0.1}$. This was followed by a 10.2 second germane-free pulse. The flow rate of a gas mixture of 20% silane, balance hydrogen, was kept at a constant flow rate of 90 sccm. This pulse sequence was repeated until five bi-layers were formed in the quantum well, the final layer being silicon and then the germane mixture flow of 16.6 sccm was resumed to grow a second $Si_{0.7}Ge_{0.3}$ barrier over the quantum well. The deposition was performed at 600° C. and the total well thickness was 9 nm to give a 1.8 nm period.

FIG. 3A is a transmission electron microscope image of a test structure of multiple bilayers layer of germanium-seeded silicon grown on a silicon wafer. The silicon has an oscillating concentration of germanium. FIG. 3B is a graph of the germanium concentration along the direction of the arrow, integrated over 1000 pixels.

Example 2: Demonstration of Single- and Double-Quantum Dot Systems

This example illustrates the fabrication of a double quantum dot system formed from a heterostructure of the type described in Example 1 and further demonstrates the ability to achieve a valley splitting of approximately 100 µeV in a single quantum dot.

Figure 5:
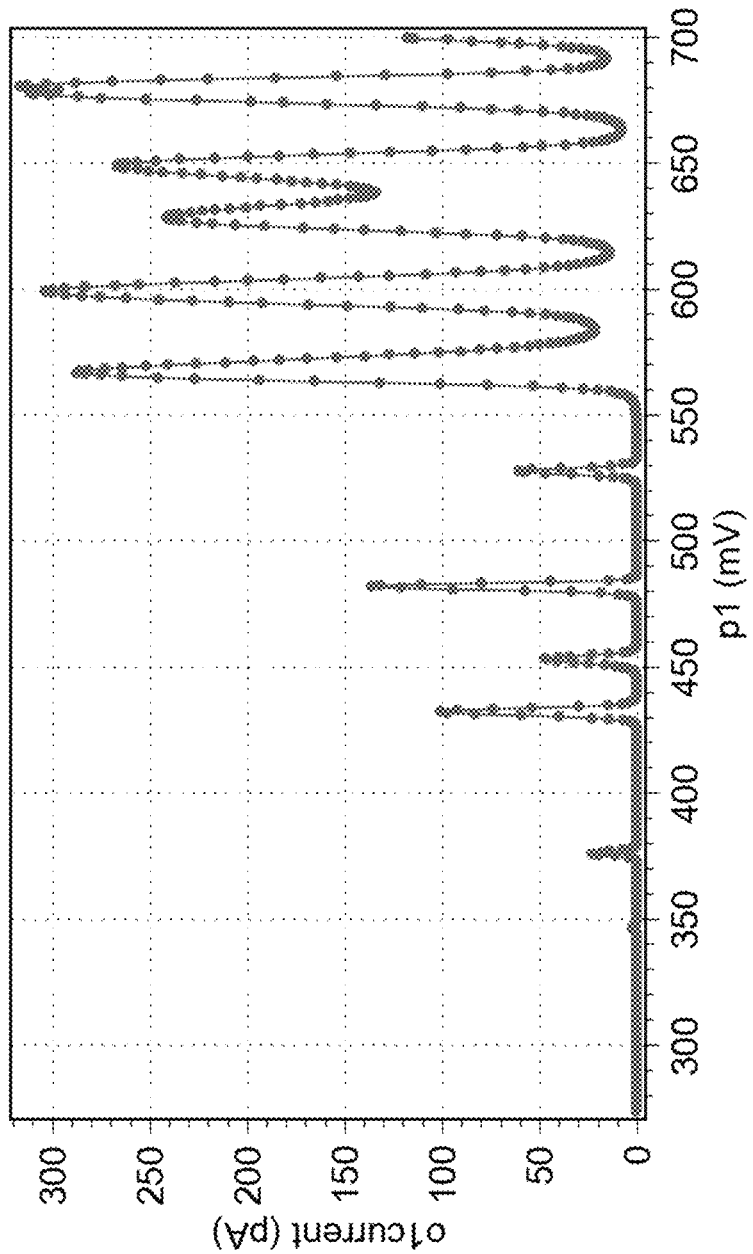
FIG. 5 shows the current-voltage relation produced by passing a current through a two-quantum dot assembly, in accordance with Example 2.
Figure 6:
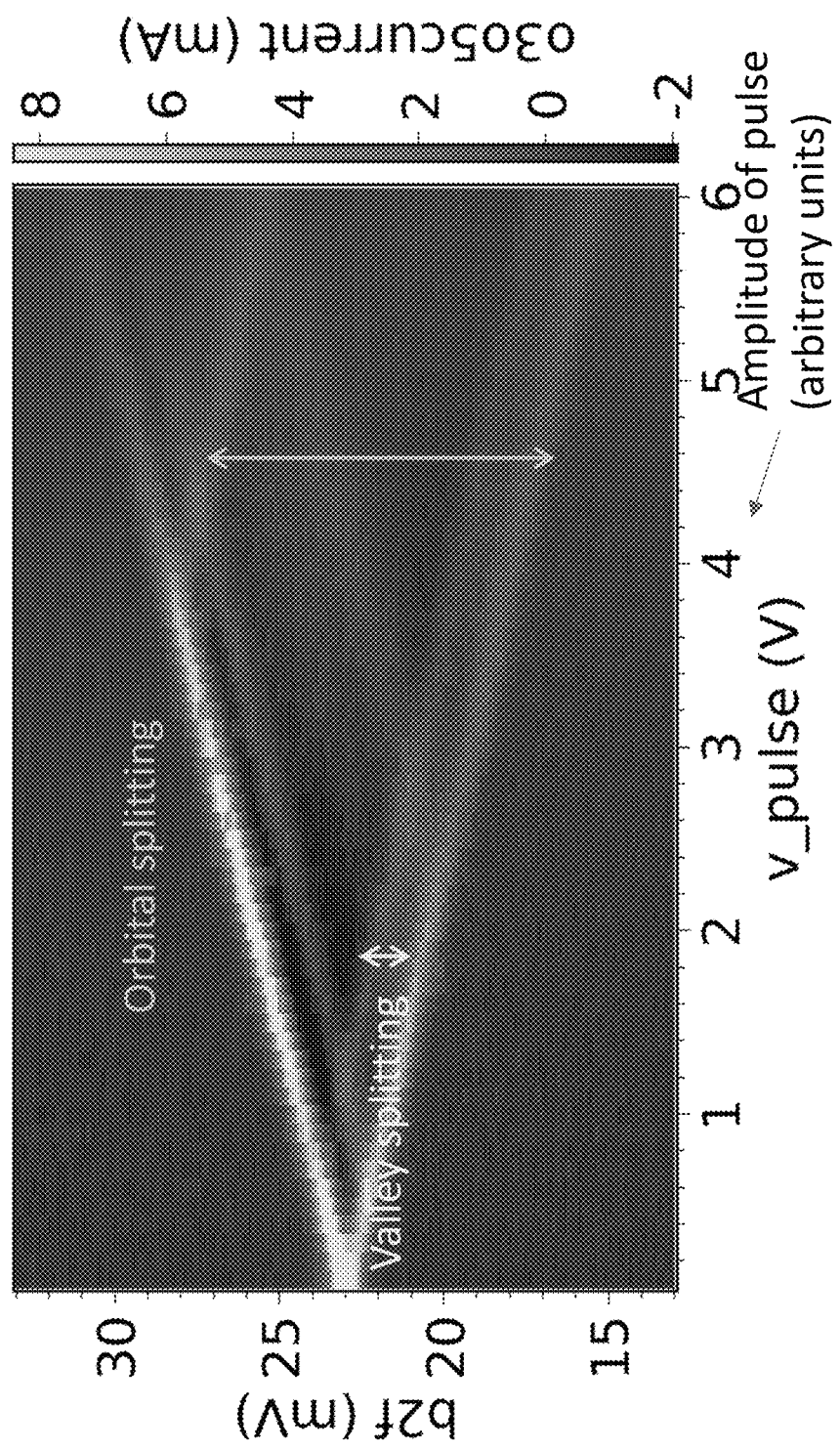
FIG. 6 shows the measured energy-level structure of a single quantum dot, obtained by applying a 1 MHz square pulse to a nearby gate. The levels show up as bright lines in a plot of voltage vs. pulse amplitude. Using standard methods, the voltages can be converted to energies of electron levels.

The measured valley splitting for the single quantum dot on three days is shown in Table 1. FIG. 5 shows the current-voltage relation produced by passing a current through a two-quantum dot assembly. These data were obtained by applying a 1 MHz square pulse to a nearby gate electrode. The levels show up as bright lines in a plot of voltage vs. pulse amplitude (FIG. 6). Using standard methods, the voltages were converted to energies of electron levels.

TABLE 1

| Date | $1^{st}$ valley/ST (µeV) | $2^{nd}$ valley/ST (µeV) |
|---|---|---|
| Day 1 1 electron | 139 +/− 6 | 100 +/− 4 |
| Day 2 1 electron | 83 +/− 2 | 159 +/− 4 |
| Day 3 2 electron | 107 +/− 5 | 83 +/− 6 |

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more."

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A semiconductor heterostructure comprising:
   a first quantum barrier comprising a layer of silicon-germanium alloy or a layer of germanium;
   a second quantum barrier comprising a layer of silicon-germanium alloy or a layer of germanium; and
   a quantum well comprising strained, germanium-seeded silicon disposed between the first quantum barrier and the second quantum barrier, wherein the germanium concentration in the germanium-seeded silicon has an oscillating profile across the quantum well and the conduction band of the quantum well has a valley splitting of at least 20 μeV.

2. The heterostructure of claim 1, wherein the first quantum barrier and the second quantum barrier comprise the layer of silicon-germanium alloy.

3. The heterostructure of claim 2, wherein the oscillating profile is a sinusoidally varying profile.

4. The heterostructure of claim 2, wherein the oscillating profile has a wavelength of 1.8 nm.

5. The heterostructure of claim 2, wherein the oscillating profile has a wavelength of 0.32 nm.

6. The heterostructure of claim 2, wherein the maximum concentration of germanium along the germanium concentration profile is no greater than 30 at. %.

7. The heterostructure of claim 2, wherein the maximum concentration of germanium along the germanium concentration profile is no greater than 20 at. %.

8. The heterostructure of claim 1, wherein the quantum well has a valley splitting in the range from 20 μeV to 100 μeV.

9. A gate-controlled quantum dot comprising:
   a semiconductor heterostructure comprising:
      a first quantum barrier comprising a layer of silicon-germanium alloy or a layer of germanium;
      a second quantum barrier comprising a layer of silicon-germanium alloy or a layer of germanium; and
      a quantum well comprising strained, germanium-seeded silicon disposed between the first quantum barrier and the second quantum barrier, wherein the germanium concentration in the germanium-seeded silicon has an oscillating profile across the quantum well; and
   one or more electrostatic gates in electrical communication with the semiconductor heterostructure, wherein the one or more electrostatic gates are configured to apply a controllable potential to the quantum well that confines electrons in the quantum well in three dimensions.

10. The quantum dot of claim 9, wherein the first quantum barrier and the second quantum barrier comprise the layer of silicon-germanium alloy.

11. The quantum dot of claim 9, wherein the oscillating profile is a sinusoidally varying profile.

12. The quantum dot of claim 9, wherein the oscillating profile has a wavelength of 1.8 nm.

13. The quantum dot of claim 9, wherein the oscillating profile has a wavelength of 0.32 nm.

14. The quantum dot of claim 9, wherein the maximum concentration of germanium along the germanium concentration profile is no greater than 30 at. %.

15. The quantum dot of claim 9, wherein the maximum concentration of germanium along the germanium concentration profile is no greater than 20 at. %.

16. A quantum computing system for performing quantum computation, the system comprising:
   a semiconductor heterostructure comprising:
      first quantum barrier comprising a layer of silicon-germanium alloy or a layer of germanium;
      a second quantum barrier comprising a layer of silicon-germanium alloy or a layer of germanium; and
      a quantum well comprising strained, germanium-seeded silicon disposed between the first quantum barrier and the second quantum barrier, wherein the germanium concentration in the germanium-seeded silicon has an oscillating profile across the quantum well; and
   one or more electrostatic gates in electrical communication with the semiconductor heterostructure, the one or more electrostatic gates being configured to apply controllable potentials to the quantum well, wherein the controllable potentials define one or more gate-controlled qubits in the heterostructure;
   a controller for controlling the potentials applied by the one or more electrostatic gates; and
   a sensor for reading out a state of the one or more qubits.

17. The quantum computing system of claim 16, wherein the first quantum barrier and the second quantum barrier comprise the layer of silicon-germanium alloy.

18. The quantum computing system of claim 17, wherein the oscillating profile is a sinusoidally varying profile.

19. The quantum computing system of claim 17, wherein the oscillating profile has a wavelength of 1.8 nm.

20. The quantum computing system of claim 17, wherein the oscillating profile has a wavelength of 0.32 nm.

21. The quantum computing system of claim 17, wherein the maximum concentration of germanium along the germanium concentration profile is no greater than 30 at. %.

22. The quantum computing system of claim 17, wherein the maximum concentration of germanium along the germanium concentration profile is no greater than 20 at. %.

23. A method of forming a quantum-confined semiconductor heterostructure, the method comprising:
   growing a quantum well layer of strained, germanium-seeded silicon on a first quantum barrier layer comprising germanium or a germanium-silicon alloy via pulsed chemical vapor deposition using a pulse sequence comprising:
      a first pulse having a germanium concentration that corresponds to a peak germanium concentration; and
      a germanium-free pulse, wherein the pulse sequence is repeated at least twice; and
   growing a second quantum barrier layer comprising germanium or a germanium-silicon alloy over the quantum well layer.

24. The method of claim 23, wherein the pulse sequence further comprises:
   one or more intermediate pulses between the first pulse and the germanium-free pulse, the one or more intermediate pulses having germanium concentrations between zero and the peak germanium concentration; and
   one or more additional intermediate pulses after the germanium-free pulse, the one or more additional intermediate pulses having germanium concentrations between zero and the peak germanium concentration.

* * * * *